US006458723B1

(12) United States Patent
Henley et al.

(10) Patent No.: US 6,458,723 B1
(45) Date of Patent: Oct. 1, 2002

(54) HIGH TEMPERATURE IMPLANT APPARATUS

(75) Inventors: Francois J. Henley, Aptos; Michael A. Bryan, Los Gatos; William G. En, Milpitas, all of CA (US)

(73) Assignee: Silicon Genesis Corporation, Campbell, CA (US)

( * ) Notice: Subject to any disclaimer, the term of this patent is extended or adjusted under 35 U.S.C. 154(b) by 0 days.

(21) Appl. No.: 09/594,464

(22) Filed: Jun. 14, 2000

Related U.S. Application Data

(60) Provisional application No. 60/141,115, filed on Jun. 24, 1999.

(51) Int. Cl.$^7$ .................... H01L 21/26; H01L 21/324; H01L 21/42; H01L 21/477
(52) U.S. Cl. .............. 438/795; 250/492.21; 250/492.2; 250/443.1; 118/730; 438/710
(58) Field of Search ................. 250/492.2, 492.21, 250/442.11, 398, 443.1, 423 R; 118/730; 438/680, 689, 710, 795

(56) References Cited

U.S. PATENT DOCUMENTS

| | | | |
|---|---|---|---|
| 3,855,110 A | 12/1974 | Quinn et al. ........... 204/298.02 |
| 3,926,147 A | 12/1975 | Steube ................. 118/723 VE |
| 4,006,340 A | 2/1977 | Gorinas ................. 219/121.47 |
| 4,042,128 A | 8/1977 | Shrader ....................... 414/287 |
| 4,304,983 A | 12/1981 | Pierfederici ........... 219/121.43 |
| 4,322,661 A | 3/1982 | Harvey ........................ 315/344 |
| 4,345,968 A | 8/1982 | Coe ............................. 216/59 |
| 4,371,412 A | 2/1983 | Nishizawa .................. 156/345 |
| 4,461,783 A | 7/1984 | Yamazaki ................... 136/258 |
| 4,500,563 A | 2/1985 | Ellenberger et al. ........ 438/710 |
| 4,543,465 A | 9/1985 | Sakudo et al. ........... 219/121.4 |
| 4,566,403 A | 1/1986 | Fournier .................... 118/718 |
| 4,615,298 A | 10/1986 | Yamazaki ................ 118/723 R |
| 4,632,719 A | 12/1986 | Chow et al. ................. 370/249 |
| 4,745,337 A | 5/1988 | Pichot et al. ........... 315/111.41 |
| 4,756,882 A | 7/1988 | Jacobs et al. ................. 422/23 |
| 4,764,394 A | 8/1988 | Conrad ........................ 427/525 |
| 4,803,332 A | 2/1989 | Koyama et al. ........ 219/121.52 |
| 4,810,935 A | 3/1989 | Boswell .................. 315/111.41 |
| 4,811,684 A | 3/1989 | Tashiro et al. ............. 118/50.1 |
| 4,826,646 A | 5/1989 | Bussard ....................... 376/129 |
| 4,846,928 A | 7/1989 | Dolins et al. ................. 438/16 |
| 4,847,792 A | 7/1989 | Barna et al. ................. 702/182 |
| 4,853,250 A | 8/1989 | Boulos et al. ............... 427/446 |
| 4,887,005 A | 12/1989 | Rough et al. ........... 315/111.21 |
| 4,891,118 A | 1/1990 | Ooiwa et al. ........... 204/298.34 |
| 4,911,814 A | 3/1990 | Matsuoka et al. ...... 204/298.17 |
| 4,948,458 A | 8/1990 | Ogle ........................... 438/729 |
| 4,950,377 A | 8/1990 | Huebner ................. 204/192.32 |
| 4,950,956 A | 8/1990 | Asamaki et al. ........ 315/111.21 |
| 4,951,601 A | 8/1990 | Maydan et al. ............. 118/719 |
| 4,952,273 A | 8/1990 | Popov ........................... 216/70 |
| 4,960,073 A | 10/1990 | Suzuki et al. ......... 118/723 MR |
| 4,990,229 A | 2/1991 | Campbell et al. ....... 204/298.06 |
| 4,996,077 A | 2/1991 | Moslehi et al. ............. 427/562 |

(List continued on next page.)

Primary Examiner—Wael Fahmy
Assistant Examiner—Hsien-Ming Lee
(74) Attorney, Agent, or Firm—Townsend & Townsend & Crew LLP

(57) ABSTRACT

An ion implantation apparatus and method. The apparatus has a vacuum chamber and an ion beam generator to generate an ion beam in the vacuum chamber. The apparatus also has an implant wheel (10), in the vacuum chamber, having a plurality of circumferentially distributed substrate holding positions. Each of the substrate holding positions comprises a substrate holder (17), which includes an elastomer overlying the substrate holder (17) and a thermal insulating material (71) (e.g., quartz, silicon, ceramics, and other substantially non-compliant materials) overlying the elastomer (72). The present thermal insulating material increases a temperature of a substrate as it is implanted.

12 Claims, 8 Drawing Sheets

U.S. PATENT DOCUMENTS

| | | |
|---|---|---|
| 5,015,353 A | 5/1991 | Hubler et al. ................ 427/527 |
| 5,032,205 A | 7/1991 | Hershkowitz et al. ...... 156/345 |
| 5,061,838 A | 10/1991 | Lane et al. ............ 219/121.59 |
| 5,122,251 A | 6/1992 | Campbell et al. ...... 204/298.06 |
| 5,133,826 A | 7/1992 | Dandl ........................ 156/345 |
| 5,178,739 A | 1/1993 | Barnes et al. .......... 204/192.12 |
| 5,183,775 A | 2/1993 | Levy .......................... 438/386 |
| 5,198,725 A | 3/1993 | Chen et al. .............. 315/111.41 |
| 5,202,095 A | 4/1993 | Houchin et al. ............ 422/186 |
| 5,203,958 A | 4/1993 | Arai et al. .................. 156/643 |
| 5,203,960 A | 4/1993 | Dandl ........................ 216/70 |
| 5,223,108 A | 6/1993 | Hurwitt ................ 204/192.12 |
| 5,234,529 A | 8/1993 | Johnson ...................... 156/345 |
| 5,250,328 A | 10/1993 | Otto .......................... 427/535 |
| 5,252,178 A | 10/1993 | Moslehi ...................... 134/1.1 |
| 5,273,610 A | 12/1993 | Thomas, III et al. ....... 156/345 |
| 5,277,751 A | 1/1994 | Ogle ............................. 134/2 |
| 5,280,154 A | 1/1994 | Cuomo et al. ......... 219/121.52 |
| 5,286,296 A | 2/1994 | Sato et al. .................. 118/719 |
| 5,289,010 A | 2/1994 | Shohet .................. 250/492.21 |
| 5,296,272 A | 3/1994 | Mattosian et al. .......... 427/523 |
| 5,304,279 A | 4/1994 | Coultas et al. .............. 156/345 |
| 5,304,282 A | 4/1994 | Flamm ....................... 216/68 |
| 5,308,414 A | 5/1994 | O'Neil et al. ................ 216/60 |
| 5,342,472 A | 8/1994 | Imahashi et al. ........... 156/345 |
| 5,346,578 A | 9/1994 | Benzing et al. ............. 156/345 |
| 5,354,381 A | 10/1994 | Sheng .................... 118/723 E |
| 5,362,353 A | 11/1994 | Mallon ....................... 156/345 |
| 5,368,710 A | 11/1994 | Chen et al. ............ 204/192.32 |
| 5,370,765 A | 12/1994 | Dandl ........................ 216/69 |
| 5,374,456 A | 12/1994 | Matossian et al. .......... 427/570 |
| 5,374,564 A | 12/1994 | Bruel ........................ 438/455 |
| 5,401,350 A | 3/1995 | Patrick et al. .............. 156/345 |
| 5,404,079 A | 4/1995 | Ohkuni et al. .......... 315/111.81 |
| 5,405,480 A | 4/1995 | Benzing et al. ............. 156/345 |
| 5,411,591 A | 5/1995 | Izu et al. .................... 118/718 |
| 5,411,592 A | 5/1995 | Ovshinsky et al. ......... 118/718 |
| 5,413,955 A | 5/1995 | Lee et al. ................... 438/456 |
| 5,421,891 A | 6/1995 | Campbell et al. ....... 118/723 R |
| 5,431,799 A | 7/1995 | Mosley et al. ......... 204/298.06 |
| 5,435,880 A | 7/1995 | Minato et al. .............. 156/345 |
| 5,436,175 A | 7/1995 | Nakato et al. .............. 438/766 |
| 5,464,476 A | 11/1995 | Gibb et al. ........... 118/723 MP |
| 5,487,785 A | 1/1996 | Horiike et al. ........... 118/723 E |
| 5,490,910 A | 2/1996 | Nelson et al. .......... 204/192.15 |
| 5,498,290 A | 3/1996 | Matossian et al. ....... 118/723 E |
| 5,504,328 A | 4/1996 | Bonser ....................... 250/288 |
| 5,531,834 A | 7/1996 | Ishizuka et al. .......... 118/723 I |
| 5,554,223 A | 9/1996 | Imahashi .................. 118/723 I |
| 5,571,366 A | 11/1996 | Ishii et al. ................... 156/345 |
| 5,572,038 A | 11/1996 | Sheng et al. ........... 250/492.21 |
| 5,587,038 A | 12/1996 | Cecchi et al. ................ 156/345 |
| 5,593,741 A | 1/1997 | Ikeda ........................ 427/579 |
| 5,614,055 A | 3/1997 | Fairbairn et al. ............ 156/345 |
| 5,641,969 A * | 6/1997 | Cooke et al. ............ 250/492.21 |
| 5,648,701 A | 7/1997 | Hooke et al. ........... 315/111.21 |
| 5,651,868 A | 7/1997 | Canady et al. ......... 204/298.25 |
| 5,653,811 A | 8/1997 | Chan ....................... 118/723 I |
| 5,654,043 A | 8/1997 | Shao et al. .................. 427/527 |
| 5,658,418 A | 8/1997 | Coronel et al. .......... 156/272.8 |
| 5,661,043 A | 8/1997 | Rissman et al. ............. 438/162 |
| 5,662,819 A | 9/1997 | Kadomura .................. 438/711 |
| 5,674,321 A | 10/1997 | Pu et al. .............. 118/723 MR |
| 5,681,393 A | 10/1997 | Takagi .................... 118/723 R |
| 5,683,548 A | 11/1997 | Hartig et al. ................ 438/729 |
| 5,686,796 A | 11/1997 | Boswell et al. ......... 315/111.51 |
| 5,702,562 A | 12/1997 | Wakahara .................... 216/60 |
| 5,707,486 A | 1/1998 | Collins ....................... 156/345 |
| 5,710,057 A | 1/1998 | Kenney ....................... 438/406 |
| 5,711,812 A | 1/1998 | Chapek et al. ........... 118/723 E |
| 5,753,320 A | 5/1998 | Mikoshiba et al. ......... 427/572 |
| 5,772,832 A | 6/1998 | Collins et al. .............. 156/345 |
| 5,804,027 A | 9/1998 | Uchida ....................... 156/345 |
| 5,824,602 A | 10/1998 | Molvik et al. .............. 438/714 |
| 5,939,831 A | 8/1999 | Fong et al. ............. 315/111.21 |
| 5,961,773 A | 10/1999 | Ichimura et al. ............ 156/345 |
| 5,976,259 A | 11/1999 | Yamazaki ................... 118/719 |
| 5,983,906 A | 11/1999 | Zhao et al. .................. 134/1.1 |
| 5,985,032 A | 11/1999 | Eriguchi ..................... 118/712 |
| 5,985,091 A | 11/1999 | Suzuki ........................ 156/345 |
| 5,985,102 A | 11/1999 | Liephart ................ 204/192.12 |
| 6,051,073 A | 4/2000 | Chu et al. ................... 156/345 |
| 6,051,151 A | 4/2000 | Keller et al. ................. 216/68 |
| 6,068,784 A | 5/2000 | Collins et al. ................ 216/68 |
| 6,095,085 A | 8/2000 | Agarwal ............... 118/723 MP |
| 6,132,552 A | 10/2000 | Donohoe et al. ............ 156/345 |
| 6,136,140 A | 10/2000 | Ishii ........................... 156/345 |
| 6,204,607 B1 | 3/2001 | Ellingbok .............. 315/111.51 |

\* cited by examiner

HIGH TEMPERATURE IMPLANT APPARATUS

CROSS REFERENCES TO RELATED APPLICATIONS

This application claims priority to U.S. Provisional Application No. 60/141,115 filed Jun. 24, 1999, hereby incorporated by reference for all purposes.

BACKGROUND OF THE INVENTION

The present invention relates to the manufacture of integrated circuits. More particularly, the present invention provides a technique for forming substrates using a high temperature implantation technique. This invention is illustrated using, for example, silicon wafers, but can be applied to other types of substrates.

There are many conventional ion implanter designs. In most of these designs, it is desirable to maintain a cool implant temperature for semiconductor processing applications, where high temperatures often damage integrated circuit device elements and structures. In fact, many conventional designs even include fluid cooling systems, which draw heat away from the implanted substrate to maintain temperatures below 100 degrees Celsius. In some applications, however, it is desirable to allow for the implantation of ions while the implantation target (e.g., silicon wafers) are brought to a higher temperature than is usual for conventional semiconductor processing.

Such implanters have been specially designed for such implantation at higher temperature. These implanters are often expensive and not general purpose. That is, these implanters often cannot be used in an efficient manner for both semiconductor processing applications and special high temperature implantation processes. For example, Hitachi and Ibis Technology Corporation each make a high temperature implantation apparatus. This implantation apparatus is used for a wafer making process known as Separation by Implantation of OXygen, commonly called SIMOX, whereupon a high-dose of oxygen ions are selectively placed within a depth of a silicon wafer to create a Silicon-On-Insulator (SOI) structure. It is often a requirement of this process for the silicon substrate to be heated and kept at approximately 550 degrees Celsius during the implantation. As a result, SIMOX implanters (such as the Ibis 1000 implanter for example) have specially designed wafer holders and wheels that incorporate heating mechanisms. This design is often complex and generally makes the high temperature implanter not general purpose that cannot be used for more general semiconductor purpose implantation in an easy manner.

Alternatively, general semiconductor purpose implanters such as the xR-120 series implant tools from Applied Materials, Inc. have been designed specifically to keep the substrates cooled during implantation (on the order of 40–60 degrees Centigrade) in order to satisfy dopant implant process requirements for semiconductor processing. In fact, the implant wheel is designed with water cooling in the wheel mechanism and thus the wheel surface could not be heated much above 80 degrees Centigrade without severe problems arising. In such implanters, the substrate is placed on a cooled wheel, which draws away heat generated during implantation from the substrate. This general purpose implanter is often difficult to modify to achieve high temperature operation.

From the above, it is seen that an improved technique for implanting substrates at selected temperatures in an efficient manner is highly desirable.

SUMMARY OF THE INVENTION

According to the present invention, a technique including a method and apparatus for implanting ion species at high temperature into a substrate is provided. In an exemplary embodiment, the present apparatus has a thermal insulating layer that prevents a portion of thermal energy from being drawn off by a substrate holder. This thermal insulating layer allows a wafer temperature to increase to a selected steady state value during implantation in certain embodiments.

In a specific embodiment, the present invention provides an ion implantation apparatus. The apparatus has a vacuum chamber and an ion beam generator to generate an ion beam in the vacuum chamber. The apparatus also has an implant wheel, in the vacuum chamber, having a plurality of circumferentially distributed substrate holding positions. Each of the substrate holding positions comprises a substrate holder, which includes an elastomer overlying the substrate holder and a thermal insulating material (e.g., quartz, silicon, ceramics, etc.) overlying the elastomer. The present thermal insulating material prevents a portion of thermal energy to be drawn off by the substrate holder, which therefore increases a temperature of the substrate as it is implanted. A steady state value of substrate temperature can be achieved using the present apparatus.

In an alternative aspect, the present invention provides a method for implanting lighter mass particles into a substrate. The method includes providing a substrate holder, which has an elastomer overlying the substrate holder, and a thermal insulating material overlying the elastomer. The method also includes placing a substrate onto the substrate holder. The substrate has a face to be implanted and a backside, which is placed on the thermal insulating material. The method also includes introducing a plurality lighter mass particles through the face of the substrate. The lighter mass particles can be selected from hydrogen particles, deuterium particles, helium particles, or any combination of these and even other heavier particles in some applications. The method also includes increasing a temperature of the substrate, at least partially, during the introducing from a first temperature (e.g., room-temperature) to a higher second steady state value that is greater than about 150 or 200 or 400 or 500 degrees Centigrade. During the step of increasing the temperature, a thermal flux from the substrate is substantially equal to a thermal flux into the substrate at the steady state value.

The present invnetion also provides a method for converting a high temperature implant tool from a conventional implant tool design, such as an xR Series from Applied Materials, Inc. The method includes installing a insulating member on an elastomer layer on a substrate holder, whereupon the insulating member faces a substrate to be implanted. The present conventional implanter can be on a fabrication facility or the like, which makes the present method easy to implement.

Numerous benefits are achieved using the present invention over conventional processes. For example, the present invention provides a novel high temperature implantation technique for general purpose beam line implanters. The technique allows for a high temperature implant using relatively simple hardware features. Additionally, the present invention also provides an easy installation technique for converting a conventional implanter such as an Applied Materials, Inc. xR-120 from a conventional lower temperature design to the present high temperature design, which can be desirable in certain applications. The present invention also provides a control for a high temperature implantation process, where the control occurs by adjusting the roughness and perhaps thickness of the insulating material. The invention also has many other benefits such as efficiency of implant species can be improved for specific species and material modification processes that depend on diffusion processes can be better controlled. Depending upon the embodiment, one or more of these advantages may exist. These and other benefits will be described throughout the present specification.

These and other embodiments of the present invention, as well as other advantages and features, are described in more detail in conjunction with the text below and attached Figs.

DESCRIPTION OF THE SPECIFIC EMBODIMENTS

According to the present invention, a technique including a method and apparatus for implanting impurities at high temperature into a substrate is provided. In an exemplary embodiment, the present apparatus has a thermal insulating layer that prevents a portion of thermal energy from being drawn off by a substrate holder. This thermal insulating layer allows a wafer temperature to increase to a selected steady state value during implantation.

Figure 1:
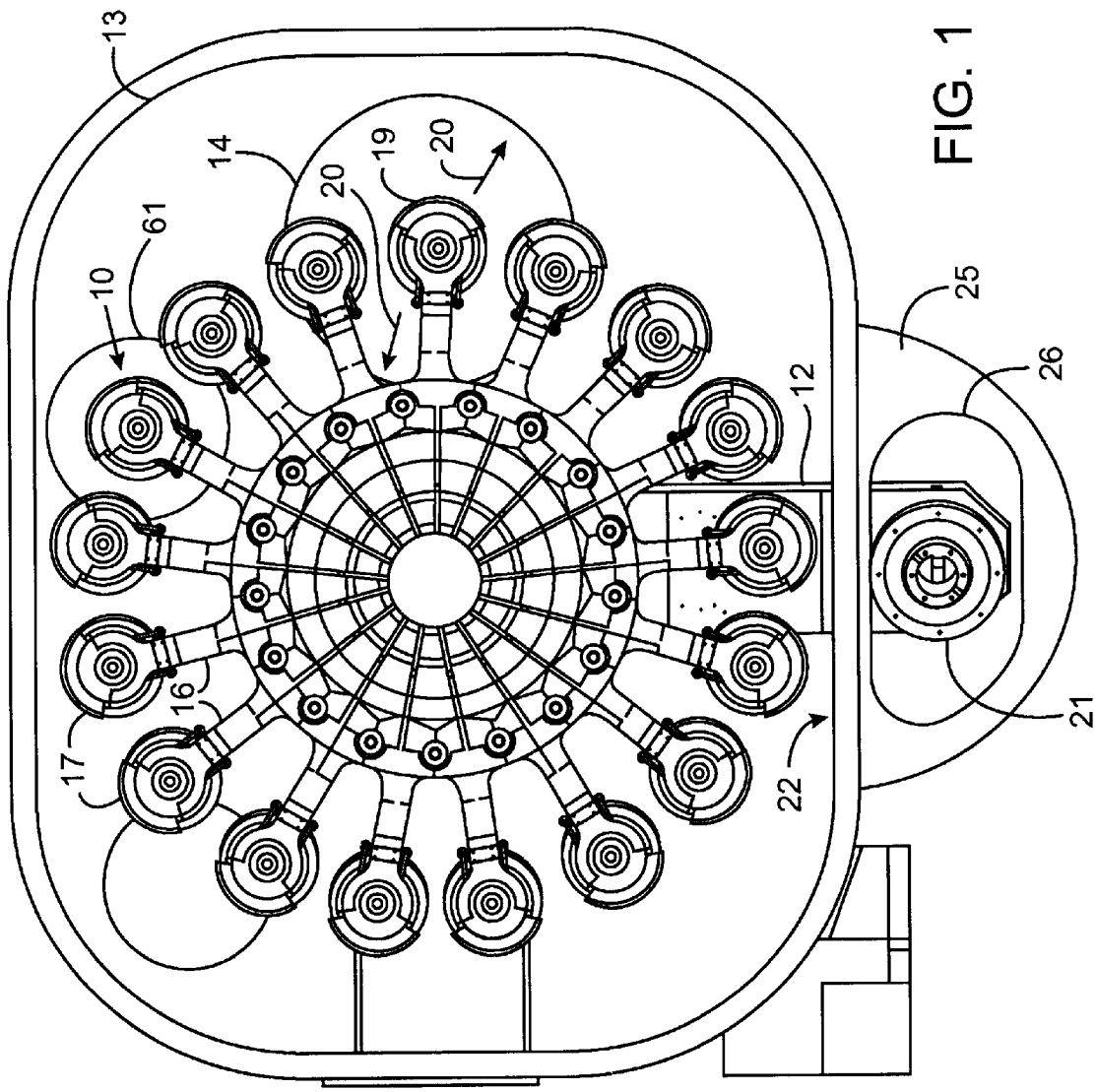
FIG. 1 is a front view in elevation of an implant wheel for an implantation apparatus, mounted within a vacuum chamber, the rear door of the vacuum chamber being removed for illustration purposes according to an embodiment of the present invention.
Figure 2:
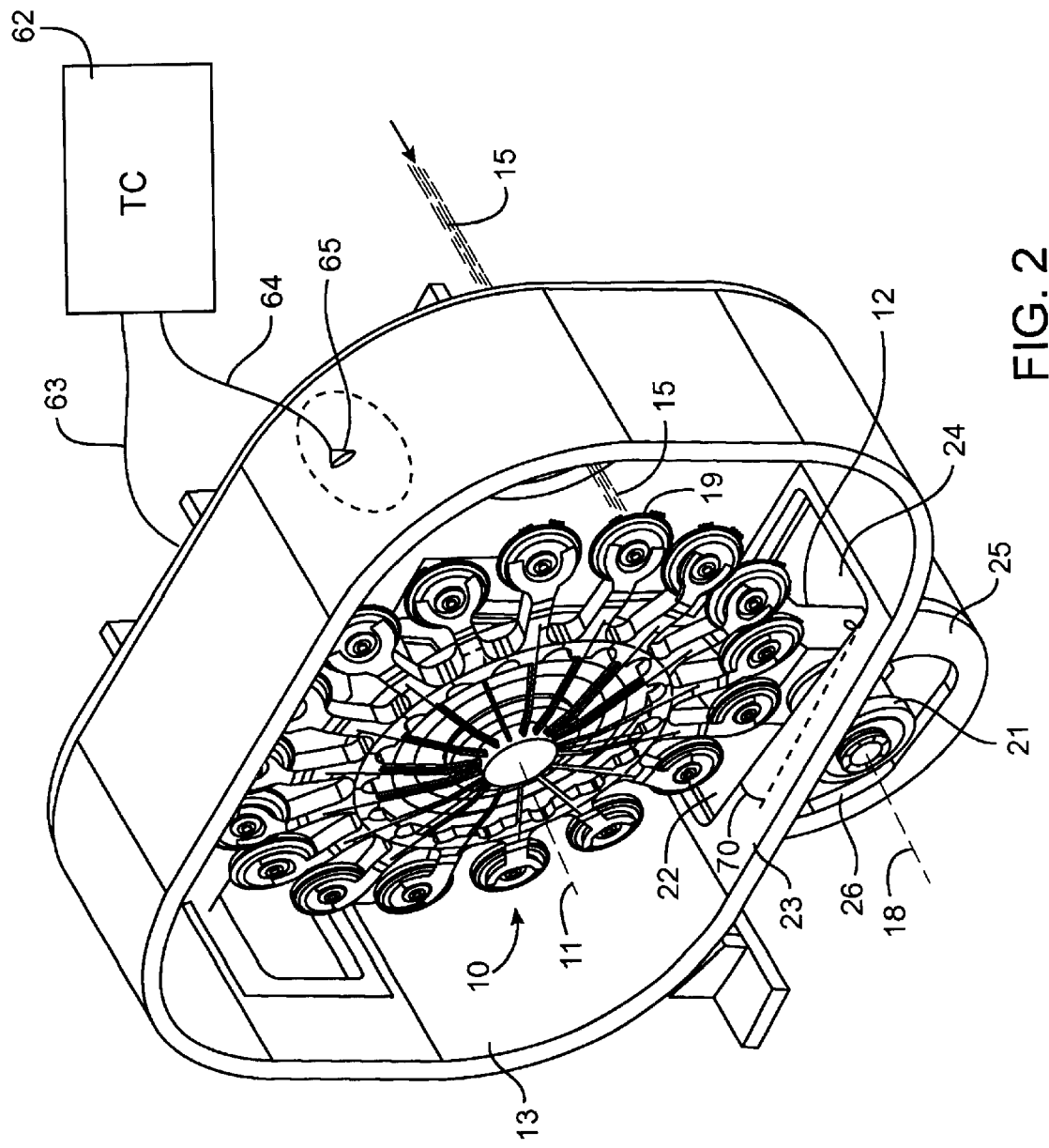
FIG. 2 is an isometric perspective view of the implant wheel in the vacuum chamber corresponding to FIG. 1 according to an embodiment of the present invention.

FIGS. 1 and 2 of the simplified drawings show the wafer processing chamber of an ion implantation apparatus. These diagrams are merely examples, which should not limit the scope of the claims herein. One of ordinary skill in the art would recognize many other variations, modifications, and alternatives. In a complete ion implantation machine a beam of ions of the chemical species to be implanted in the wafer is extracted from an ion source. In typical ion implantation processes, the beam comprises ions of phosphorous $P^+$, arsenic $As^+$, or boron $B^+$. The implantation process can also introduce ions of oxygen or the like for making SOI wafers by SIMOX or like processes. The ions in the beam are then accelerated or decelerated to a desired energy at which they are to be implanted in the wafer. Typically, also, the ion beam drawn from the ion source is first passed through a mass selection region to select from all the ions present in the beam those particular ions required for implantation. The ion source, the mass selection arrangement, and other parts of the beam line of a typical ion implantation apparatus are not shown in FIGS. 1 and 2, which show only the final stage of the apparatus where the required ions impinge upon and become implanted in the wafer or wafers under treatment.

In other embodiments, the ion implantation processes smaller mass particles. Depending upon the application, smaller mass particles are generally selected to reduce a possibility of damage to the wafer for selected cleaving applications, surface treatment applications, and others. Smaller mass particles easily travel through the wafer or substrate material to the selected depth without substantially damaging the material region that the particles traversed through. For example, the smaller mass particles (or energetic particles) can be almost any charged (e.g., positive or negative) and/or neutral atoms or molecules, or electrons, or the like. In a specific embodiment, the particles can be neutral and/or charged particles including ions such as H+ ions and its isotopes (e.g., deuterium). The particles can also be derived from compounds such as gases, e.g., hydrogen gas, and other light atomic mass particles. Alternatively, the particles can be any combination of the above particles and/or ions and/or molecular species and/or atomic species. The particles generally have sufficient kinetic energy to penetrate through the surface to the selected depth underneath the surface. The particles distribute themselves through the material region to the selected depth. Implantation of these lighter mass particles can be advantageous for a cleaving process such as a controlled cleaving process described in U.S. Ser. No. 09/026,115, which is incorporated by reference herein or a process called Smart Cut described in U.S. Pat. No. 5,374,564, which is incorporated by reference herein or a process called Eltran by Canon.

Thus, in FIGS. 1 and 2, an implant wheel 10 is shown mounted for rotation about an axis 11 (FIG. 2) on the free end of a scanning arm 12. The entire implant wheel 10 and scanning arm 12 are themselves mounted inside a vacuum chamber 13. In the drawings, the rear door of the vacuum chamber is removed to reveal the implant wheel and scanning arm within. In a complete ion implantation machine, the required ion beam enters the vacuum chamber 13 through an entry port located in the center of flange 14. In FIG. 1, the entry port is hidden behind a part of the implant wheel 10 and in FIG. 2 the entry port cannot be seen behind a wall part of the vacuum chamber 13. However, the general line of the beam of ions supplied to the vacuum chamber 13 is shown in FIG. 2 at 15. It will be understood by those experienced in this field that all sections of the implantation apparatus through which the ion beam travels are evacuated and so the portion of the beam outside the vacuum chamber 13 is also in an evacuated region.

The implant wheel comprises a number of radial spokes 16 each having a wafer carrier 17 at its outer extremity. Further details of the wafer carrier are provided below. Wafers for treatment are carried on the reverse faces of the carrier 17 as shown in FIG. 1. The wafer supporting faces on the carrier 17 are arranged to be angled slightly radially inwards relative to the axis of rotation of the wheel 10, so that on rotation, the wafers are pressed firmly against the faces through centrifugal force. The angle of the carrying faces of the carrier 17 to a plane perpendicular to the axis of rotation of the wheel is typically 7°. It will be appreciated that as the wheel 10 rotates, the individual carriers 17 of the wheel 10 successively interrupt the ion beam 15 as they move past the region of the flange 14.

The ion beam 15 has dimensions transversely of the ion beam direction, which are considerably smaller than the diameters of the wafer supporting surfaces on the carrier 17, and of the wafers themselves. In order to ensure that all regions of a wafer are evenly exposed to the ion beam during the process, the wheel 10 is rotated at relatively high speed, and at the same time, the scanning arm 12 reciprocates to and from about an axis 18 (FIG. 2). As a result of the reciprocating action of the scanning arm 12, the position of the wafer carrier 17 as they pass the region of the ion beam, represented by the wafer carrier 19 in FIGS. 1 and 2, is progressively translated to and from in the direction of the arrows 20. The scanning arm 12 is mounted for the reciprocating motion on a rotary seal 21, located in a well 22 extending through the floor 23 of the vacuum chamber 13. The well 22 has front and back walls 24 and 25. In FIGS. 1 and 2, the back wall 25 is broken away at 26 for illustrative purposes only so as to reveal the lower end of the scanning arm 12.

The back wall 25 of the well extends vertically downwards from the floor 23 of the chamber 13 but is angled at 7° to the transverse dimension of the vacuum chamber 13, as can be seen best in FIG. 2. Since the rotary seal 21 is mounted on the back wall 25 so that the scan axis 18 is perpendicular to the back wall 25, this axis 18 is angled at 7° to the direction of the ion beam 15. The implant wheel 10 is mounted for rotation on the scanning arm 12 so that the axis 11 of rotation of the implant wheel is also maintained in the same plane as the scanning axis 18. Thus, with the wheel axis 11 substantially horizontal as illustrated in FIG. 2, the wheel axis 11 is also at 7° to the beam direction. As a result, the wafer carrier 19 intersecting the beam 15 holds the wafer being implanted precisely normal to the beam direction. The angle of the back wall 25 of the well 22 cancels the angle of the carrying face of the carrier 19 when the carrier intersects the ion beam.

In a specific embodiment, the present invention also includes a heating device 61. The heating device provides thermal energy to the substrates to be implanted or substrates as they are being implanted. The heating device can include a radiant heater, a quartz heater, a quartz, halogen heater, a strip heater, a high energy light source, or other type of suitable heating means, which is disposed facing each of the substrates. The heating source can be placed at a single location in the vacuum chamber as shown or can be distributed through the vacuum chamber, depending upon the application. The heating source can also be coupled to a temperature controller 62. The temperature controller is also coupled to a temperature sensor 65, which measures a temperature of the substrates being processed. As shown, the temperature sensor can be any suitable unit such as a pyrometer or others. The temperature controller can be connected to the heating device through wire elements 63. The temperature controller can also be connected to the temperature sensor using wire elements 65. Of course, the exact way the present heating device operates depends upon the application.

In some embodiments, the present invention provides a control system for maintaining a selected steady state temperature on the wafer. The present control system monitors a temperature of the wafer during implantation. In most conventional systems, the implantation flux can cause changes in temperature, since the implantation source may vary in energy. Here, the changes in temperature can be compensated in-situ or an automated manner to provide the desired steady state value. The desired steady state value is achived by adding thermal energy to the wafer by way of the external heating device such as the quartz heater, the quartz halogen heater, or other heating device, which selectively applys thermal energy to the wafer. Once the desired amount of thermal energy is added, the controller selectively stops addiing the thermal energy. The present control system can have any suitable feed back control system such as proportional control, derivative control, integral control, or any combination of these to achive the desired feed back to maintain the desired steady state temperature during implantation. Of course, the type of controller used depends upon the application.

Figure 3:
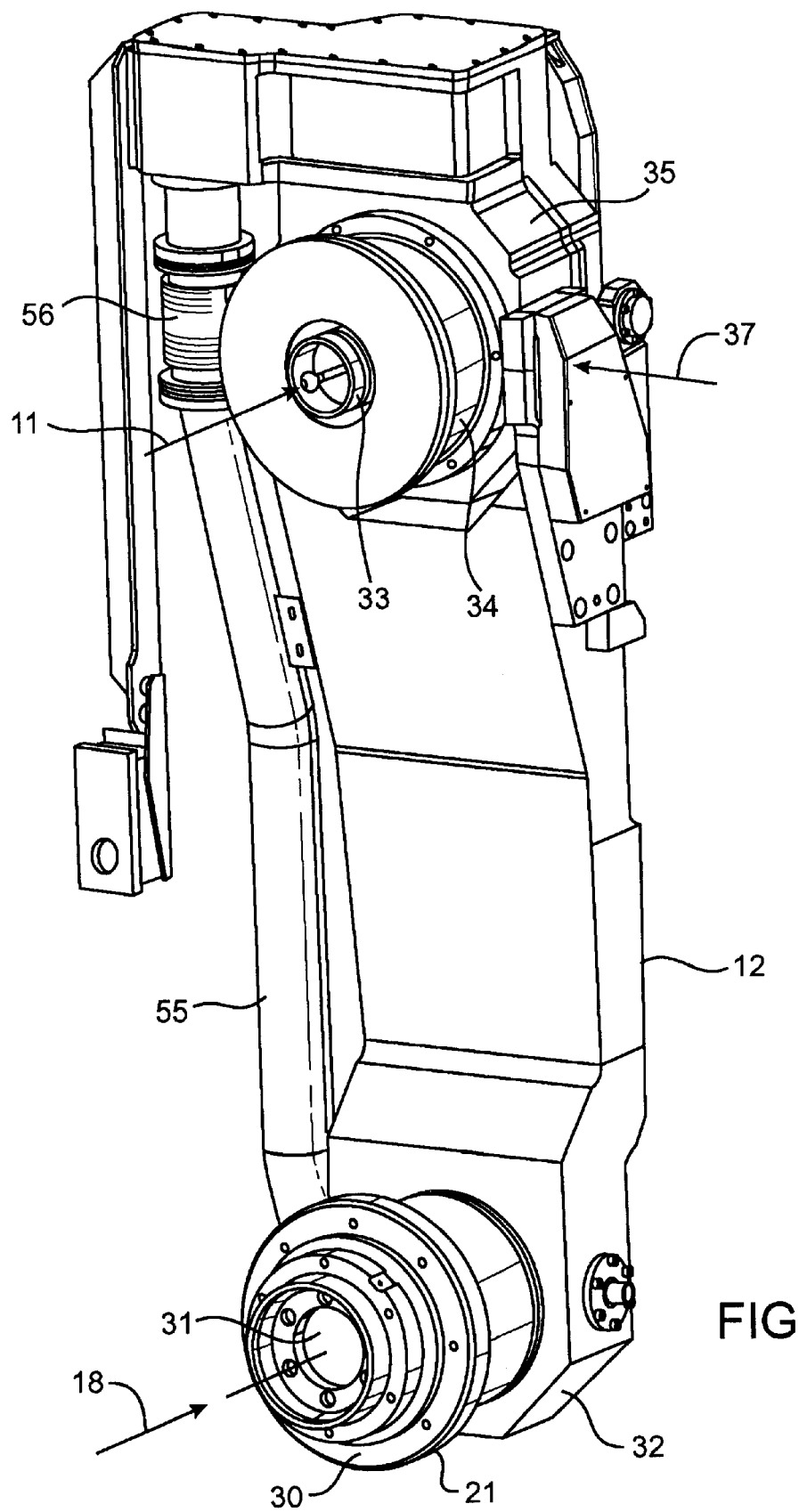
FIG. 3 is an isometric perspective view from the rear and one side of the scanning arm employed to support and scan the implant wheel illustrated in FIGS. 1 and 2 according to an embodiment of the present invention.
Figure 4:
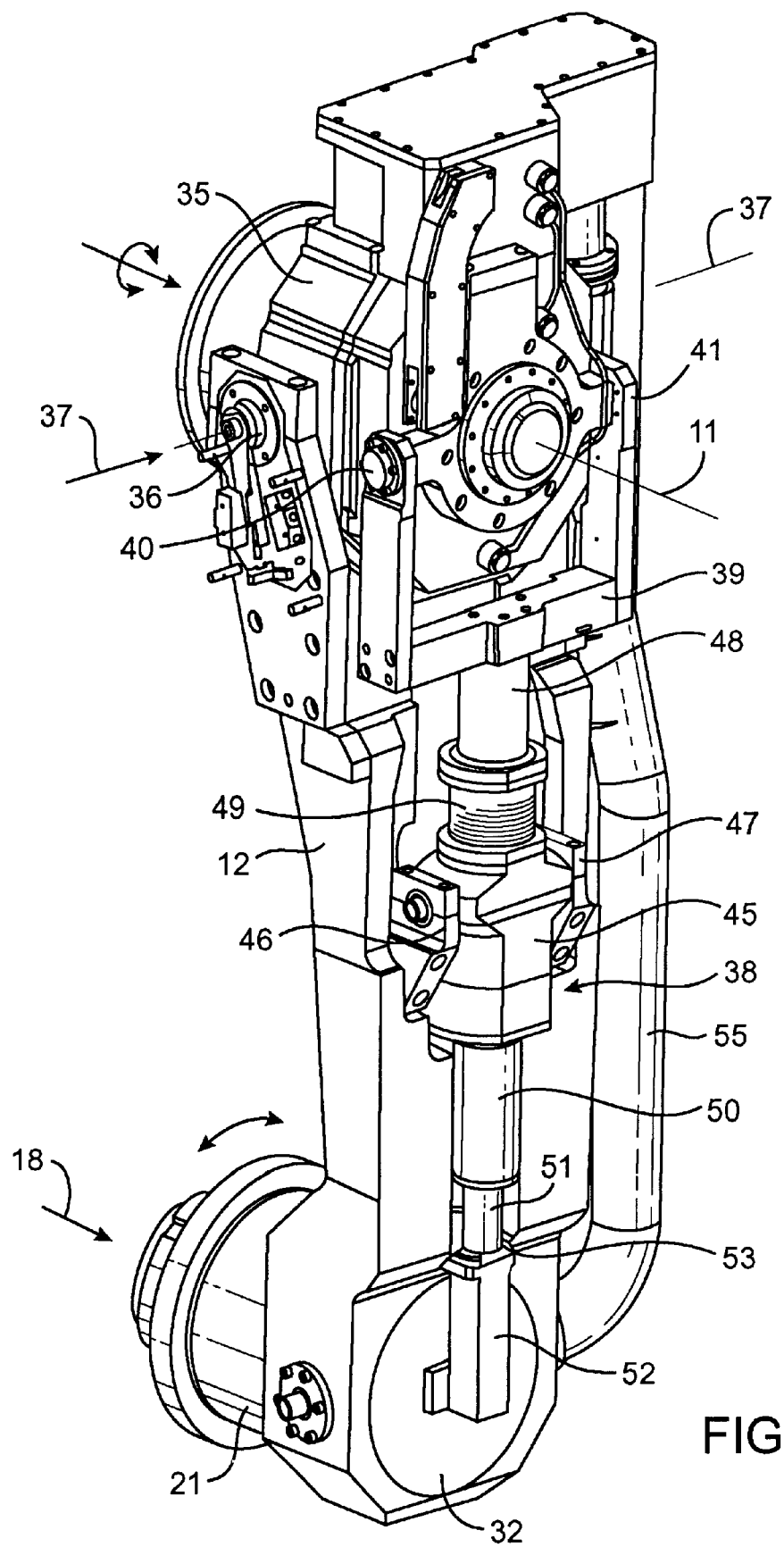
FIG. 4 is an isometric perspective view of the scanning arm of FIG. 3 from the front and side according to an embodiment of the present invention.

Referring now to FIGS. 3 and 4, these illustrate the scanning arm 12 with the implant wheel removed for clarity. The rotary vacuum seal 21 is shown connected to the bottom end of the scanning arm 12. The vacuum seal 21 includes a flange 30 for connection of the vacuum seal in an aperture in the rear wall 25 of the well 22 described above. The rotary vacuum seal may comprise a ferro-fluidic seal or other forms of rotary seal known in this field. The rotary vacuum seal 21 permits the scanning arm 12 to rotate relative to the flange 30 about the scan axis 18. An open bore 31 is provided through the center of the vacuum seal, communicating with the interior of a sealed enclosure 32 at the bottom end of the arm 12. The open bore 31 also permits services, such as electrical supply, connections to sensors, data leads, and also supply and return of cooling liquid, to be fed through the vacuum seal from outside the vacuum chamber 13 to the various facilities provided on the scanning arm and implant wheel.

In some embodiments, the present bore 31 also permits for return of a cooling liquid to be fed through the vacuum seal from outside the vacuum chamber. In one embodiment, the present implant apparatus has a cooling fluid, which maintains a selected temperature implant process. The cooling fluid generally draws heat away from the substrate holder, and maintains a selected temperature of the substrate holder. An example of a cooling fluid can include water, glycol-based fluid. Other fluids can also be used depending upon the application. The fluid can selectively maintain temperature of the fluid at about 60 degrees Celsius or about 80 degrees Celsius and greater.

At the upper end (in the Figures) of the scanning arm 12, a mounting hub 33 for the implant wheel is mounted on an implant wheel bearing forming part of a further rotary vacuum seal, shown generally at 34. Again this rotary vacuum seal may be a ferro-fluidic seal of the kind known for vacuum applications. The outer casing of the ferro-fluidic seal 34 is fixed to a further casing 35 containing an electric motor for driving the implant wheel. The motor casing 35 provides a vacuum sealed enclosure containing the rotor and stator of the motor.

The entire assembly comprising motor housing 35 with motor, and the rotary vacuum seal 34 (together in practice with the implant wheel itself mounted on the hub 33) is mounted by means of trunnion bearings shown generally at 36, so that the assembly can be tilted about an axis 37. The angle of tilt is controlled by a linear actuator, shown generally at 38, acting via a yoke 39 journaled to the motor housing 35 at bearing points 40 and 41. The bearing points 40 and 41 are spaced from the tilt axis 37 in a direction perpendicular to the line of action of the linear actuator 38, so that operation of the actuator 38 alters the angle of tilt of the motor housing 35, the rotary vacuum seal 34, and in practice, the entire implant wheel mounted on the hub 33.

The linear actuator 38 comprises an electric motor housed in a sealed casing 45. The motor drives a roller screw on a threaded rod. The casing 45 with the motor and captive nut are journaled between thrust brackets 46 and 47 mounted on the scanning arm 12. The threaded rod driven by the actuator motor is integral with or fastened to an actuator rod 48 which is in turn connected to the yoke 39. Movement of the actuator rod 48 relative to the casing 45 is accommodated by a bellows seal 49.

The casing 45 includes an extension 50 to which is connected a short length of pipe 51. The pipe 51 is in turn connected to a square section conduit 52 fastened to and communicating with the rotating part of the rotary vacuum seal 21. The connection between the pipe section 51 and the square section conduit 52 is by means of a short bellows seal 53, which can accommodate the small rotational movement of the actuator housing 45 about the journal axis in the thrust brackets 46 and 47, as the actuator rod 48 and yoke 39 move up or down to adjust the tilt of the implant wheel.

The square section conduit 52 allows the sealed interior of the casing 45 to communicate through the rotary vacuum seal 21 with atmosphere outside the vacuum enclosure 13. A further discreet pipe 55 provides atmospheric pressure communication between the interior of the implant wheel motor housing 35 and ambient atmosphere, again by communicating through the rotary vacuum seal 21. The pipe 55 is linked to the motor housing 35 by a bellows seal 56, to accommodate movement of the housing 35 as the tilt of the implant wheel is changed.

Figure 5:
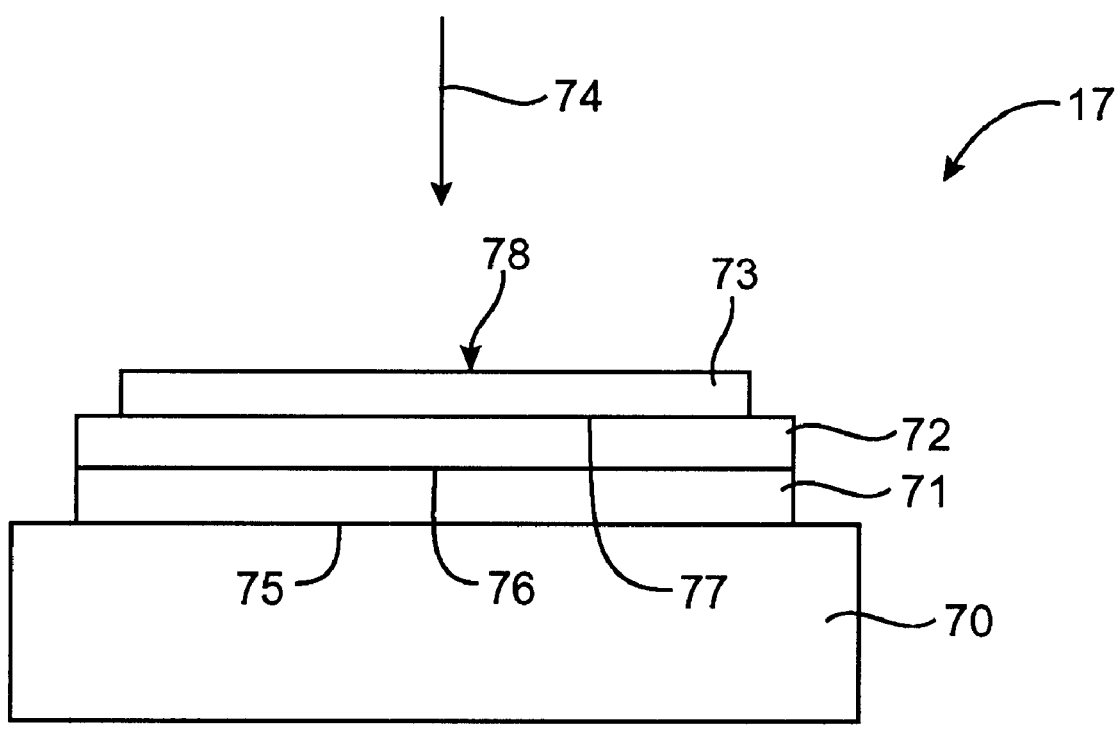
FIG. 5 is a simplified side view diagram of a substrate holder according to an embodiment of the present invention.

FIG. 5 is a simplified side view diagram of the wafer carrier 17 or substrate holder according to an embodiment of the present invention. This diagram is merely an illustration, which should not limit the scope of the claims herein. One of ordinary skill in the art would recognize many other variations, alternatives, and modifications. As shown, the wafer carrier 17 has a substrate block 70, which attaches to the tilt wheel. The substrate block can be made of a suitable material such as aluminum, an alloy, or other material. The block has enough stuctural support to hold the wafer during implantation.

The substrate block includes an overlying 75 elastomer. The elastomer can be made of any suitable heat resistant material that is compliant and has sufficient heat resistant characteristics. The elastomer also provides for a shock absorbing interface between a wafer to be implanted and the substrate block. An example of such an elastomer is a proprietary product made by a company called Applied Materials, Inc., but can also be others. Depending upon the embodiment, a film 75 can be placed between the elastomer and the substrate block. The film can be an adhesive film such as an organic, compliant, sticky, polymer film, as well as other films.

Overlying the elastomer is thermal insulating layer or material 72. The thermal insulating material tends to prevent heat transfer from the wafer 73 to the elastomer material during processing. The thermal insulating material has a surface, which comes in contact with the elastomer material. A film or other material, however, can be inserted between such thermal insulating material and the elastomer material in some applications. In a preferred embodiment, a polished side of the thermal insulating material is contacted onto the elastomer and is held there through the elastomer's natural adhesion properties. Here, the elastomer often conforms to the insulating material. Alternatively, a thin and "clean" removable adhesive can be placed in between 72 and 71, which holds the thermal insulating material to the elastomer. The thermal insulating material should have sufficient structural support to support and hold the wafer in place. The insulating material can be any suitable material such as quartz, silicon, ceramics, or other thermal insulating material. Generally, the material should not be compliant but hard to degrade and limit the vacuum conduction heat transfer property between the substrate 73 and thermal insulating material 72. The material may also have a sufficient thickness to prevent heat from being conducted away from the substrate to the elastomer material. The insulating layer also has a thickness of about 200 um and greater or about 600 um and greater. The thickness, however, should be less than about 1 mm in some embodiments, which are not limiting, to avoid becoming a hindrance to the automatic wafer handling system. The insulating layer also has, preferably, a substantially rough surface 77 that comes in contact with the wafer 73 surface, although smooth surfaces also would degrade conduction heat transfer according to this invention. Also shown is an implant direction 74 and a surface 78 of the wafer.

Figure 6:
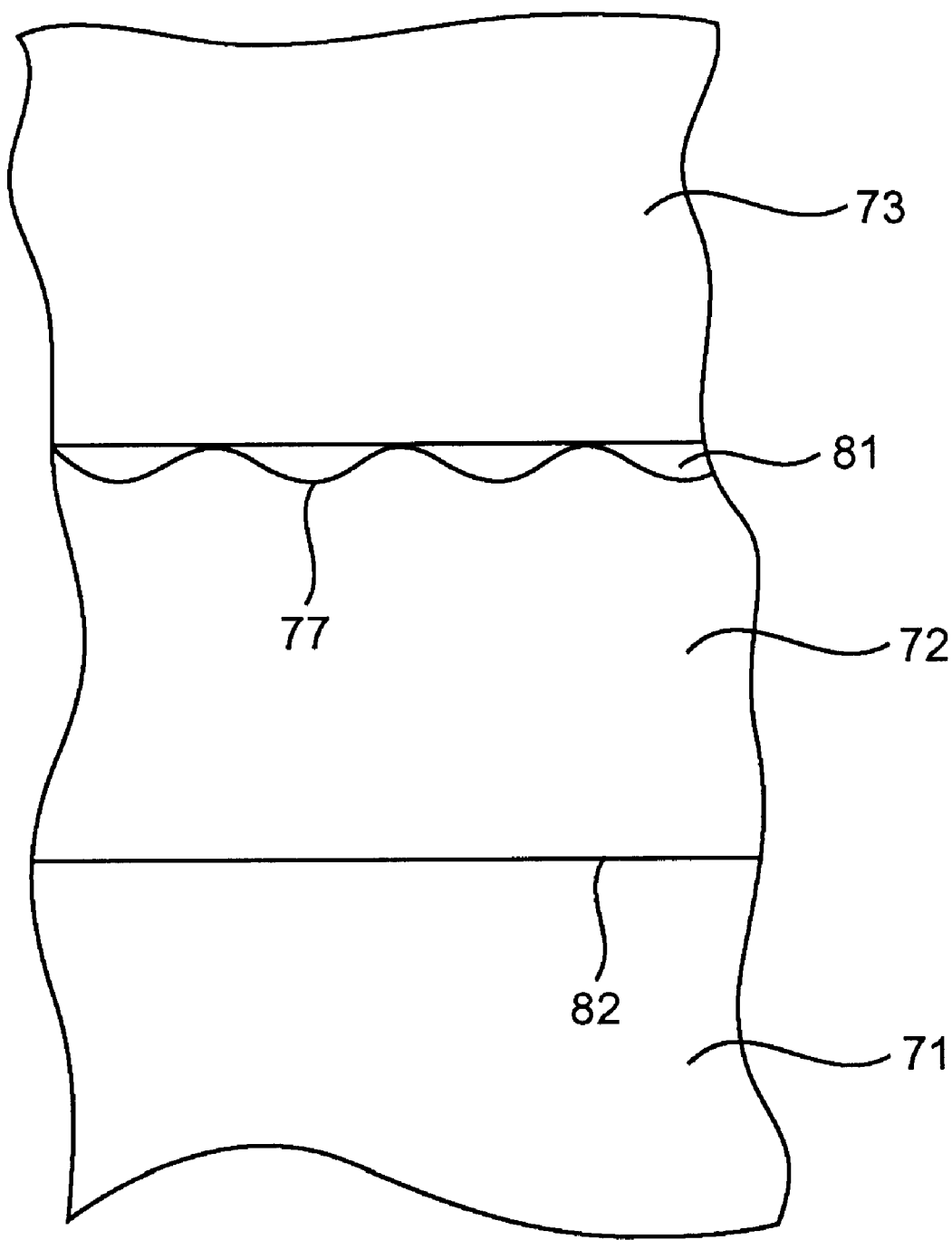
FIG. 6 is a more detailed diagram of a substrate holder according to an embodiment of the present invention.

FIG. 6 is a more detailed diagram of a substrate holder according to an embodiment of the present invention. This diagram is merely an illustration, which should not limit the scope of the claims herein. One of ordinary skill in the art would recognize many other variations, alternatives, and modifications. Like reference numerals are used in this Fig. as the other ones for easy cross-referencing, but should not be limiting. This diagram includes elastomer layer 71, overlying thermal insulating material 72, and wafer 73. Between the wafer and the insulating material are optional openings 81 or voids, that can be made through roughening the thermal insulating material 72, which prevent substantial intimate contact between such wafer 73 and such material. That is, during implantation a small portion of the total surface area between the wafer and the material are in effective conduction thermal contact with each other. This prevents a substantial portion of thermal transfer from the wafer to the insulating material. A temperature diagram of the present layers during processing is provided below.

Figure 7:
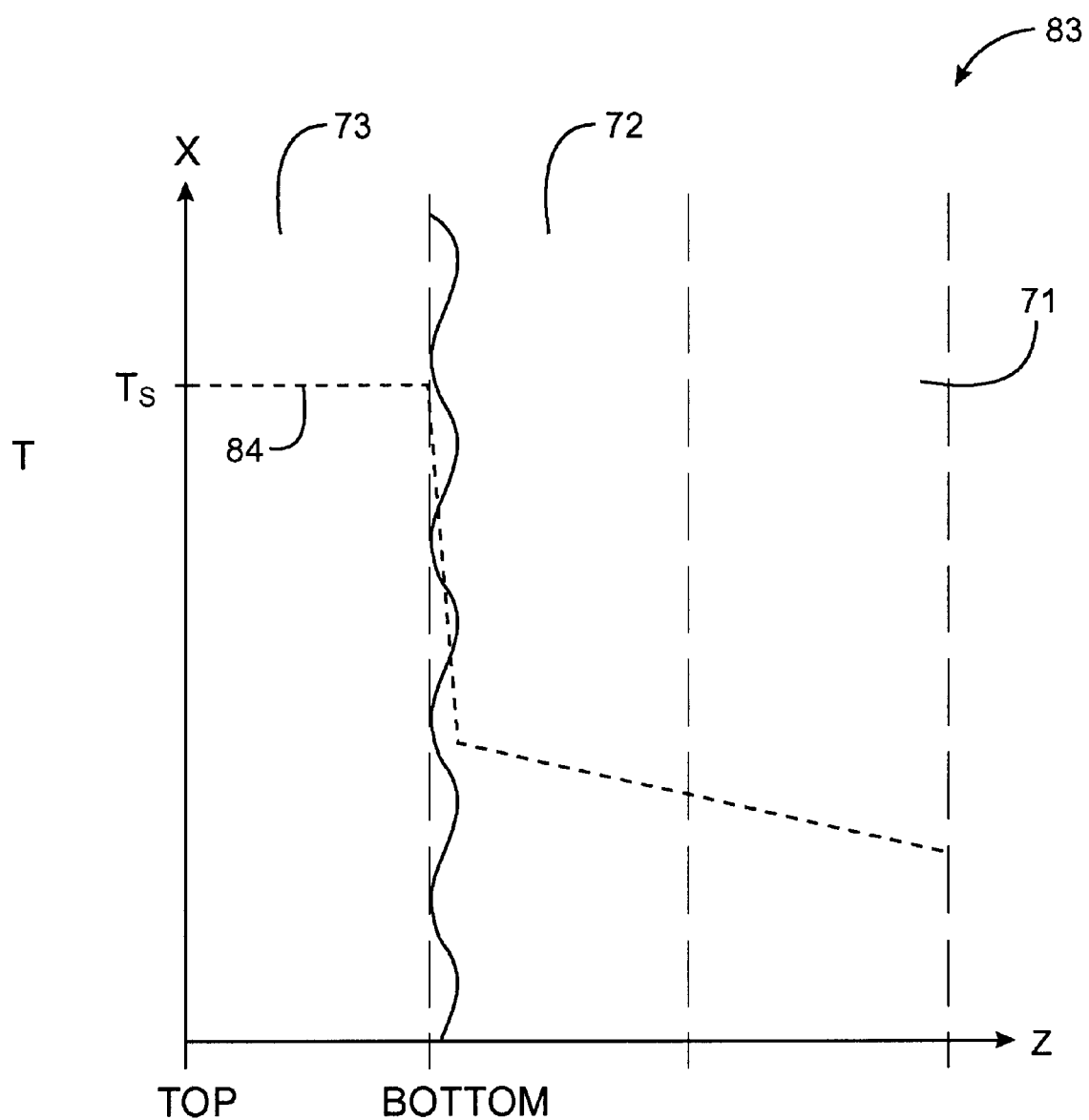
FIG. 7 is a temperature diagram of a substrate at a steady state temperature during implantation according to an embodiment of the present invention.

FIG. 7 is a temperature diagram 83 of the substrate at a steady state temperature during implantation according to an embodiment of the present invention. This diagram is merely an illustration, which should not limit the scope of the claims herein. One of ordinary skill in the art would recognize many other variations, alternatives, and modifications. During steady state, the temperature diagram may look like the one in this Fig. Here, the vertical axis represents temperature, which is indicated as "T," where a lower temperature is on the bottom portion of the axis and a higher temperature increases with increasing vertical height in the x-direction. The horizontal axis represents a dimension along the z-direction, which begins at the top of the wafer and ends at the bottom of the elastomer. As shown, the horizontal axis includes wafer 73, insulating material 72, and elastomer 71. The temperature profile is shown as a dotted line 84, which is substantially at a steady state temperature $T_s$ in substrate 73. The temperature decreases abruptly at the wafer/thermal insulating material interface and decreases in another substantially linear manner, through the thermal insulating material and the elastomer. Here, a substantial portion of the temperature loss is between the substrate and the thermal insulating material. Of course, the temperature profile will depend upon the application.

According to one specific embodiment, the present steady state condition is characterized by the following relationship:

$$HEAT_{IONBEAM} + HEAT_{ADDED} = 2\epsilon\sigma T^4$$

where:

$HEAT_{IONBEAM}$ is heat flux from the ion beam;

$HEAT_{ADDED}$ is heat flux from added heat;

$\epsilon$ is the effective wafer emissivity;

σ is Stefan-Boltzmann constant ($5.67 \times 10^{-12}$ W/cm$^2$*K$^4$);

T is temperature; and

Factor of 2 is the number of surfaces (front and back) radiating.

Using for instance a silicon wafer, the present relationship produces a desired steady state temperature, which can be selected. Here, the present technique achieves a substrate temperature of $T_s$, which is T in the present example. For example, in a 60 kV H+ implantation of an average beam current of 20 mA into a 200 mm silicon substrate wheel of 20 wafers being simultaneously implanted, the average power flux impinging on the substrates is:

$$HEAT_{IONBEAM} = 60 \text{ kV} * 20 \text{ mA}/(20*314 \text{ cm}^2) = 0.2 \text{ Watts/cm}^2;$$

emissivity of silicon=approximately 0.25 at 200–300 degrees Centigrade; and

T=approximately 240 degrees Centigrade in this case.

As shown, the steady state condition produces a temperature of about 240 degrees Centigrade. Of course, adding $HEAT_{ADDED}$ would add flux and therefore further increase the temperature to a higher steady state value. The temperature would be added by way of an external heating element, such as a quartz heater, a quartz halogen heater, a strip heater, or any combination of these. Additionally, the previous example is merely an illustration, which should not limit the scope of the claims herein. One of ordinary skill in the art would recognize many other variations, modifications, and alternatives.

A method according to an embodiment of the present invention for converting a conventional implanter to an implanter for high temperature operation is provided as follows:

(1) Provide a conventional low temperature implanter (which may be in a fabrication facility);

(2) Remove implanter from line to off line (e.g., utilities, fluid);

(3) Open vacuum chamber of implanter to expose each of the substrate holders, where each of the substrate holders comprise an elastomer material face;

(4) Provide a plurality of insulating material members;

(5) Attach one insulating material member to each of the substrate holders, where a face of the member engages with the elastomer material face;

(6) Secure the member to the face; and (7) Perform implanting process, as noted above.

The above steps show an example of converting a conventional implanter from low temperature operation to the present implanter for high temperature use. The present implanter uses a combination of steps including attaching an insulating material onto an elastomer member. The insulating material prevents a portion of thermal energy from being drawn off by the elastomer member. This increases a temperature of a substrate during implantation to a steady state value. Details of the present method are shown by way of the Fig. below.

Figure 8:
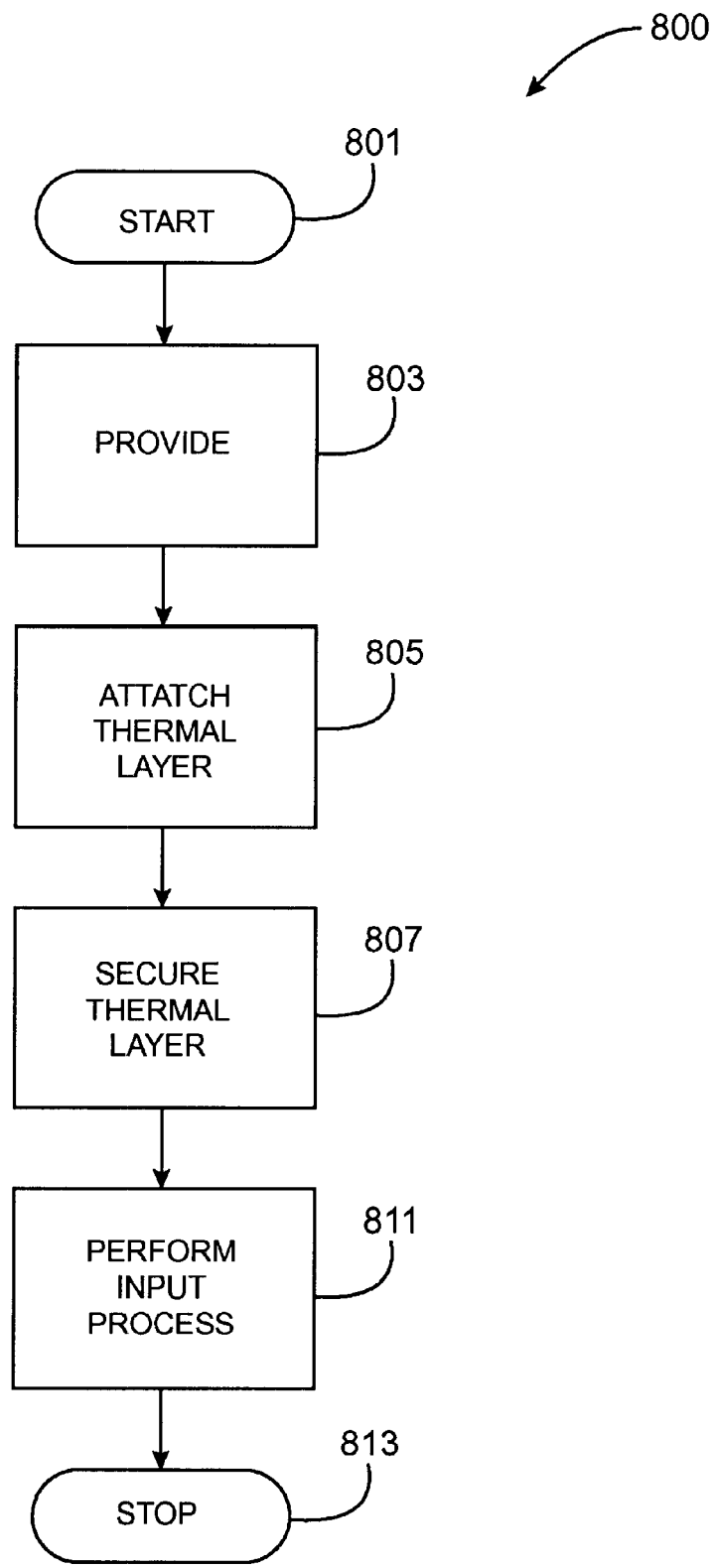
FIG. 8 is a simplified flow diagram of a process according to an embodiment of the present invention

FIG. 8 is a simplified flow diagram 800 of a process according to an embodiment of the present invention. This diagram is merely an example which should not limit the scope of the claims herein. One of ordinary skill in the art would recognize many other variations, modifications, and alternatives. The present method begins at start, step 301. Here, the present method provides a conventional low temperature implanter (step 803). The conventional low temperature implanter can be in the fabrication facility and be used for conventional semiconductor processing as well as others. The conventional implanter can be one from the xR Series from Applied Materials, Inc. and the like. The conventional implanter is turned off and taken off line for maintenance. The vacuum chamber is opened to expose each of the substrate holders, where each of the substrate holders comprise an elastomer material face. Here, the substrate holders can be removed or can be modified on-line depending upon the exact configuration of the implant tool.

The present method generally provides a plurality of the insulating material members, such as those noted above for example. These insulating members each have a certain thickness and are made of a selected material. The thermal insulating material should have sufficient structural support to support and hold the wafer in place. The insulating material can be any suitable material such as quartz, silicon, ceramics, an alloy, or other thermal insulating material. Generally, the material should not be compliant to the substrate or wafer, but should be hard to degrade and limit the vacuum conduction heat transfer property between the wafer and thermal insulating material. The material may also have a sufficient thickness to prevent heat from being conducted away from the wafer to the elastomer material. The insulating layer also has a thickness of about 200 um and greater or about 600 um and greater. The thickness, however, should be less than about 1 mm in some embodiments, which are not limiting, to avoid becoming a hindrance to the automatic wafer handling system. The insulating layer also has, preferably, a substantially rough surface that comes in contact with the wafer surface, although smooth surfaces also would degrade conduction heat transfer according to this invention.

The method attaches (step 805) the thermal insulating member to the elastomer on the wafer holder. Here, a first face of the insulating member faces the elastomer. In a specific embodiment, the first face is generally compliant with the face of the elastomer. This draws any heat from the thermal insulating material to the elastomer, which draws off the heat to maintain an elastomer temperature that does not degrade it during implantation. The thermal insulating material also has a second face, which is rough or textured, that faces the back side of the wafer. As noted, the textured or rough surface prevents a substantial portion of thermal energy from being drawn from the wafer to the insulating member during implantation. This increases the steady state temperature of the implanted wafer.

The insulating member is secured (step 807) to the elastomer. In a specific embodiment, the insulating member attaches to the elastomer by the elastomer's natural adhesive properties. Alternatively, an adhesive or adhesive film may be applied between the elastomer and the insulating member to secure them together. In still further embodiments, the elastomer is secured to the insulating member by way of a mechanical securing device. Once the insulating member has been secured, the present method performs a high temperature implant process (step 813), such as the one described above, but can be others.

Adapting such a conventional semiconductor purpose implanter to higher-temperature operation would be desirable in such a fashion as to allow rapid and interchangeable operation between normal (cooled) implant operations and higher-temperature (heated) implant operations. Since the elastomers generally used in these functions are difficult to remove and replace, and tend to thermally break down at 180–200 degrees Centigrade, it is yet another object of the invention to allow such rapid adaptation using a method that maintains the elastomers at a cooled temperature. Lastly, automatic wafer exchanges should be unaffected by a high-temperature modification, so it is yet another advantage of the invention to achieve such high-temperature modification without compromising the automatic wafer handling of the general purpose implant system.

The above has also been described in terms of a specific insulating material, many others can also exist. For example, the insulating material can rest directly onto the substrate holder, without an elastomer in some embodiments. Additionally, the insulating material can be separated or can even be a combined stacked layer of films or materials. The insulating material can be rough or textured, as noted to prevent a portion of thermal energy to be drawn off by such material. Alternatively, a smoother layer can also be used in some embodiments. But the rough or textured surface provides voids or opens, which severely limits the amount of heat to be conducted from the wafer to the substrate holder. These and other variations may be recognized by one of ordinary skill in the art.

Although the above has been generally described in terms of a silicon wafer, the present invention can be applied to a variety of other wafers. For example the present invention can be applied to patterned wafers, bulk wafers, silicon on sapphire wafers, silicon on glass, and other multi-layered structures or substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), microdisplays, projection displays, biological and biomedical devices, and the like.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. Ion implantation apparatus comprising:

a vacuum chamber, an ion beam generator to generate an ion beam in the vacuum chamber, an implant wheel, in the vacuum chamber, having a plurality of circumferentially distributed substrate holding positions; and wherein each of the substrate holding positions comprising a substrate holder, the substrate holder comprising an elastomer overlying the substrate holder and a thermal insulating material overlying the elastomer, the thermal insulating material preventing a portion of thermal energy from an implant process to flow from a substrate to the elastomer.

2. Implantation apparatus as claimed in claim 1, wherein the elastomer is made of a compliant polymer.

3. Implantation apparatus as claimed in claim 2, wherein the thermal insulating material is selected from the group consisting of quartz, silicon, and ceramics.

4. Implantation apparatus as claimed in claim 1, wherein the thermal insulating material has a thickness about 100 um to about 2 mm, the thermal insulating material being a disk shaped member that is concentrically placed on the substrate holder.

5. Implantation apparatus as claimed in claim 1, wherein the thermal insulting material includes a first surface having a selected roughness, the first surface having the roughness being coupled to the substrate to reduce heat transfer from the substrate to the thermal insulating material, the thermal insulating material including a second surface that is substantially contacting to the elastomer to enhance thermal conduction from the thermal insulating material to the elastomer during implantation of ions into the substate.

6. Implantation apparatus as claimed in claim 1, wherein the substrate holder being coupled to a thermal sink to draw a thermal energy away from the elastomer.

7. Implantation apparatus as claimed in claim 6, wherein the thermal sink comprises a cooling fluid to draw the thermal energy away from the elastomer.

8. Implantation apparatus as claimed in claim 1, further comprising a heat source adapted to face the substrate holder.

9. Implantation apparatus as claimed in claim 8, wherein the heat source comprises a heat lamp to increase a temperature of the substrate during processing.

10. Implantation apparatus as claimed in claim 9, wherein the heat lamp is selected from the group consisting of a quartz lamp, a quartz tungsten halogen lamp, or strip heating elements.

11. Ion implantation apparatus comprising:

a vacuum chamber;

an ion beam generator to generate an ion beam in the vacuum chamber; and an implant wheel, in the vacuum chamber, having a plurality of circumferentially distributed substrate holding positions, wherein each of the substrate holding positions comprising a substrate holder, the substrate holder comprising an elastomer overlying the substrate holder and a thermal insulating material overlying the elastomer, the thermal insulating material preventing a portion of thermal energy from an implant process to flow from a substrate to the elastomer, wherein the elastomer is elastomer is made of a compliant polymer and the thermal insulating material is selected from the group consisting of quartz, silicon, and ceramics.

12. Ion implantation apparatus comprising:

a vacuum chamber;

an ion beam generator to generate an ion beam in the vacuum chamber; and an implant wheel, in the vacuum chamber, having a plurality of circumferentially distributed substrate holding positions, wherein each of the substrate holding positions comprising a substrate holder, the substrate holder comprising an elastomer overlying the substrate holder and a thermal insulating material overlying the elastomer, the thermal insulating material preventing a portion of thermal energy from an implant process to flow from a substrate to the elastomer, wherein the apparatus is used to introduce a plurality of hydrogen particles through a face of a substrate, wherein a chamber temperature is increased while the hydrogen particles are being introduced through the face of the substrate.

* * * * *